(12) United States Patent
Crowder et al.

(10) Patent No.: US 6,335,262 B1
(45) Date of Patent: Jan. 1, 2002

(54) METHOD FOR FABRICATING DIFFERENT GATE OXIDE THICKNESSES WITHIN THE SAME CHIP

(75) Inventors: Scott W. Crowder, Ossining; Anthony Gene Domenicucci, Hopewell Junction; Liang-Kai Han, Fishkill; Michael John Hargrove, Clinton Corners; Paul Andrew Ronsheim, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/231,617

(22) Filed: Jan. 14, 1999

(51) Int. Cl.[7] .................. H01L 21/31; H01L 21/8238; H01L 21/762
(52) U.S. Cl. .................. 438/440; 438/528; 438/981; 438/275; 148/DIG. 116; 148/DIG. 163
(58) Field of Search .................. 438/758, 766, 438/770, 981, 440, 528, 275, 297; 148/DIG. 116, DIG. 163

(56) References Cited

U.S. PATENT DOCUMENTS

| | | | |
|---|---|---|---|
| 4,170,492 A | 10/1979 | Bartlett et al. | |
| 4,717,687 A | 1/1988 | Verma | |
| 4,743,563 A | 5/1988 | Pfiester et al. | |
| 4,847,213 A | * 7/1989 | Pfiester | 437/24 |
| 4,945,068 A | 7/1990 | Sugaya | |
| 5,057,449 A | 10/1991 | Lowrey et al. | |
| 5,308,787 A | 5/1994 | Hong et al. | |
| 5,322,810 A | 6/1994 | Ayukawa et al. | |
| 5,330,920 A | 7/1994 | Soleimani et al. | |
| 5,358,894 A | * 10/1994 | Fazan | 437/70 |
| 5,372,951 A | 12/1994 | Anjum et al. | |

(List continued on next page.)

FOREIGN PATENT DOCUMENTS

| | | |
|---|---|---|
| JP | 2140971 A | 5/1990 |
| JP | 11-330263 | * 11/1999 |

OTHER PUBLICATIONS

Integration of Trench DRAM into a High Performance of 0.18 um Logic Technology with Copper BEOL by S. Crowder, R. Hannon, H. Ho, D. Sinitsky, S. Wu, K. Winstel, B. Khan, S.R. Stiffler, S.S. Iyer—believed to be for the 1998 International Electron Device Meeting, Dec. 1998.

1987 Derwent Publication No. 87–157760/23.

*Primary Examiner*—Mary Wilczewski
(74) *Attorney, Agent, or Firm*—Connolly Bove Lodge & Hutz; Joseph P. Abate

(57) ABSTRACT

A semiconductor structure having silicon dioxide layers of different thicknesses is fabricated by forming a sacrificial silicon dioxide layer on the surface of a substrate; implanting nitrogen ions through the sacrificial silicon dioxide layer into first areas of the semiconductor substrate; implanting chlorine and/or bromine ions through the sacrificial silicon dioxide layer into second areas of the semiconductor substrate where silicon dioxide having the highest thickness is to be formed; removing the sacrificial silicon dioxide layer; and then growing a layer of silicon dioxide on the surface of the semiconductor substrate. The growth rate of the silicon dioxide will be faster in the areas containing the chlorine and/or bromine ions and therefore the silicon dioxide layer will be thicker in those regions as compared to the silicon dioxide layer in the regions not containing the chlorine and/or bromine ions. The growth rate of the silicon dioxide will be slower in the areas containing the nitrogen ions and therefore the silicon dioxide layer will be thinner in those regions as compared to the silicon dioxide layer in the regions not containing the nitrogen ions. Also provided are structures obtained by the above process.

8 Claims, 2 Drawing Sheets

U.S. PATENT DOCUMENTS

| | | |
|---|---|---|
| 5,429,960 A | 7/1995 | Hong |
| 5,480,828 A * | 1/1996 | Hsu .......................... 437/56 |
| 5,516,707 A | 5/1996 | Loh et al. |
| 5,576,226 A | 11/1996 | Hwang |
| 5,614,421 A | 3/1997 | Yang |
| 5,672,521 A | 9/1997 | Barsan et al. |
| 5,684,317 A * | 11/1997 | Hwang ........................ 257/316 |
| 6,087,237 A * | 7/2000 | Hwang ........................ 438/302 |
| 6,091,109 A * | 7/2000 | Hasegawa .................. 257/339 |
| 6,093,659 A * | 7/2000 | Grider ........................ 438/758 |

* cited by examiner

METHOD FOR FABRICATING DIFFERENT GATE OXIDE THICKNESSES WITHIN THE SAME CHIP

TECHNICAL FIELD

The present invention is concerned with a method for simultaneously fabricating different oxide thicknesses on the same semiconductor substrate. The present invention is especially advantageous when fabricating CMOS semiconductor devices and especially for providing gate oxide insulators of different thicknesses.

BACKGROUND OF INVENTION

An increasing demand exists for providing semiconductor chips having gate oxide layers of varying thicknesses. In fact, the gate oxide thickness is a major concern in terms of reliability considerations when providing integrated circuit devices containing transistors and other circuit elements that operate at differing voltage levels. By way of example, a relatively thin gate oxide of about 40 Å is typically grown in a conventional 1.8 volt, 0.25 micron process while a relatively thick gate oxide of about 70 Å is grown in a conventional 3.3 volt, 0.5 micron process.

Device scaling trends have led to low voltage operation with relatively thin gate oxides; whereas, some circuit applications still require a relatively thick gate oxide, such as driver/receiver circuitry at the chip I/O, and some analog output devices. The thick oxide is necessary for the high voltage devices in order to ensure reliability, while the thin gate oxide is desirable for the relatively fast logic devices that use low voltages at the gate. Use of relatively thick oxide for the lower voltage transistors cause poor device performance and significantly decrease the speed.

Moreover, with the trend of trying to put as many different circuits as possible in the same chip to achieve more functionality and/or improved performance (such as Merged logic-DRAM, embedded NVM microcontrols), there are even more different possible combinations for different parts of circuits in the same chip to have different gate oxide thickness to achieve the optimized performance and reliability in the system level.

One prior method of forming different gate oxide thickness on the same substrate involves multiple masking, strip, and oxide formation steps. However, such approach typically significantly increases the overall manufacturing cost and degrades the reliability as well as yield due to the potential resist residues contamination. Besides, the oxide thickness control is more difficult because the thick oxide layer results from the combination of multiple oxide formation cycles.

Another method for providing dual gate oxide thicknesses employs nitrogen implant for retarding the oxidation rate on the thin gate oxide device component, while permitting a thicker oxide to grow where the nitrogen implant has been blocked. However, the use of nitrogen implant alone has resulted in certain problems. For instance, implanting nitrogen at high doses introduces beam damage in the channel region of the device. This damage in turn results in changes in the channel impurity distributions as well as introducing silicon defects which can degrade sub-Vt leakage (off current), gate oxide breakdown voltage as well as reliability.

Low dose of nitrogen implant for thin oxide with n-type dopant (such as As) co-implant for thick oxide is another approach proposed to achieve multi-gate oxide thickness on the wafer. The problem with this process is that it depends on the dopant to enhance the oxidation rate which limits the freedom of usage because the dopant at the same time determines the substrate concentration which is a very important parameter in the device structure.

It has also been suggested to implant relatively high concentrations of fluoride ion into selected areas of a semiconductor substrate in order to increase or enhance oxide growth in those areas. The relatively high fluoride ion concentrations promote higher oxidation rates primarily through silicon damage. Moreover, use of fluoride ions are problematic since such are not compatible, for instance, with boron-doped PFET gates, as currently used in advanced logic CMOS. In particular, fluorine promotes penetration or diffusion of boron ions into the gate oxide. Accordingly, using fluoride ions as discussed in U.S. Pat. No. 5,480,828 is not especially suitable for advanced CMOS from a practical application viewpoint.

More recently, an improved process for simultaneously fabricating different oxide thicknesses on the same semiconductor substrate employs implanting chlorine and/or bromine ions into areas of a semiconductor substrate where silicon oxide having the highest thicknesses is to be formed. This improved fabrication technique is the subject matter of U.S. patent application Ser. No. 09/090,735 filed Jun. 4, 1998, entitled "Method for Fabricating Different Gate Oxide Thicknesses within the Same Chip" to Ronsheim and assigned to International Business Machines Corporation, the assignee of this application, disclosure of which is incorporated herein by reference.

Although this latter process represents a significant improvement, there still exists room for improvement.

SUMMARY OF INVENTION

The present invention provides a process for simultaneously fabricating different oxide thicknesses on the same semiconductor substrate that overcome problems of prior suggested techniques.

The present invention makes it possible to increase or extend the range of differences in thicknesses between thicker and thinner silicon dioxide layers. According to the present invention, at least two different ions are used, one being nitrogen and the other being chlorine and/or bromine. The nitrogen is used in those areas where a slower or reduced oxidation rate is desired, while chlorine and/or bromine is used in those areas where a faster oxidation rate is desired. By employing the chlorine and bromine, the dosage of the nitrogen used can be lower than that required by prior art processes. This in turn, significantly reduces, if not entirely eliminates, problems discussed above due to nitrogen doping.

According to the present invention, chlorine and/or bromine implants are employed to affect the thick oxide device regions, which are the non-critical gate dielectrics instead of the relatively thin gate oxide regions. The thin gate oxide uniformity is critical especially as the oxides are scaled to 25 Å and less. Accordingly, controlling the thickness of thin gate oxide regions is achieved according to the present invention by employing nitrogen implants.

More particularly, the present invention is concerned with a method for simultaneously fabricating different oxide thicknesses on the same semiconductor substrate. The method of the present invention comprises forming a sacrificial layer on the surface of the semiconductor. Chlorine and/or bromine ions are implanted through the sacrificial layer into areas of the semiconductor substrate where silicon dioxide having the higher thicknesses is to be formed. It is preferred according to the present invention that the chlorine and/or bromine ions be implanted at relatively low energy levels and modest dosage levels. In particular, the chlorine and/or bromine ions are typically implanted at a dose of about $2 \times 10^{13}$ to $2 \times 10^{15}$ atoms/cm$^2$ and at an energy of about 1 to about 15 keV.

Nitrogen ions are implanted through the sacrificial layer into areas of the semiconductor substrate where silicon dioxide having the thinner thicknesses is to be formed. It is preferred according to the present invention that the nitrogen ions be implanted at relatively low energy levels and modest dosage levels. In particular, the nitrogen ions are typically implanted at a dose of about $2 \times 10^{13}$ to about $2 \times 10^{15}$ atoms/cm$^2$ and an energy of about 1 to about 15 keV.

The particular sequence of the implanting steps is not crucial and can be carried out in any order.

Moreover, according to the present invention, when more than two oxide thicknesses are desired, more than one nitrogen and/or chlorine and/or bromine implantation step can be employed with different dosages of nitrogen and/or chlorine and/or bromine. This makes it possible to tailor and fine tune many silicon dioxide thicknesses as is desired on the substrate. Furthermore, if desired, areas of the substrate where silicon dioxide is to be formed can be left undoped to achieve one more different gate oxide thickness.

After the ions are implanted, the sacrificial silicon dioxide layer is removed and a layer of silicon dioxide is then grown by thermal oxidation on the surface of the semiconductor substrate. The growth rate of the silicon dioxide in the regions containing the chlorine and/or bromine implanted ions is greater than the growth rate in regions not containing the implanted chlorine and/or bromine ions and therefore the silicon dioxide layer will be thicker in those areas compared to the silicon dioxide layer in the areas not containing the implanted chlorine and/or bromine ions.

Similarly, the growth rate of the silicon dioxide in the regions containing the nitrogen implanted ions is less than the growth rate in regions not containing the implanted nitrogen ions and therefore the silicon dioxide layer will be thinner in those areas compared to the silicon dioxide layer in the areas not containing the implanted nitrogen ions.

In addition, the present invention is concerned with a semiconductor substrate having different oxide thicknesses thereon obtained by the above method.

Also, the present invention is concerned with a semiconductor substrate having nitrogen doping in selected areas thereof, chlorine and/or bromine doping in other selected areas thereof and thermally grown silicon oxide layers on the substrate having different thicknesses, wherein the silicon dioxide layer in the regions located above those areas having the chlorine and/or bromine doping is thicker than the silicon dioxide layer in areas above the semiconductor substrate that do not include the chlorine and/or bromine doping, and wherein the silicon dioxide layer in the regions located above those areas having the nitrogen doping is thinner than the silicon dioxide layer in areas above the semiconductor substrate that do not include the nitrogen doping.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
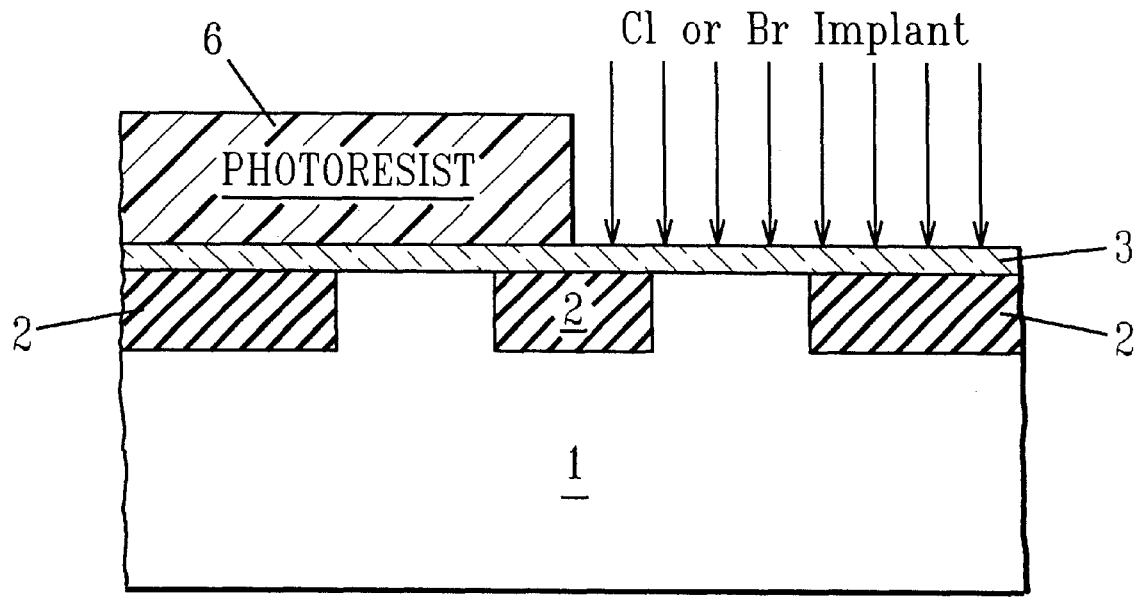
FIG. 1 is a schematic diagram of a semiconductor structure during the ion implantation of chlorine and/or bromine stage of fabrication according to the process of the present invention.

In order to facilitate an understanding of the present invention, reference is made to the figures which illustrate a portion of a partially fabricated integrated circuit. In particular, see FIG. 1 wherein is shown a semiconductor substrate 1, which is typically monocrystalline silicon or a SOI substrate (silicon on insulator). Shallow trench isolation regions 2 are formed as is conventional in the art. A layer of sacrificial silicon dioxide 3 is grown on the surface of the semiconductor substrate, typically to a thickness of about 25 to about 120 Å, with 60 Å being an example. The sacrificial silicon dioxide layer is provided for cleaning the active silicon regions of residual nitride from the previous isolation process as well as for removing the near surface silicon which may have been damaged or contaminated in the previous processing.

By way of illustration only, the discussion that follows refers to a sequence whereby chlorine and/or bromine doping occurs first and then nitrogen doping. It is understood, of course, that the sequence can be reversed.

Likewise, if more than one dosage of nitrogen and/or chlorine and/or bromine is used, any sequence of the various doping steps can be employed.

A photoresist 6 is applied over the sacrificial silicon dioxide layer and is patterned by conventional lithographic technique so as to selectively open regions in the resist where a thicker gate oxide is desired.

Chlorine and/or bromine ions, and preferably chlorine ions, are implanted through the sacrificial silicon dioxide layer into the semiconductor substrate in the regions not covered by the photoresist. The ions are implanted at a dosage of about $2 \times 10^{13}$ to about $2 \times 10^{15}$ atoms/cm$^2$ and preferably about $5 \times 10^{13}$ to about $1 \times 10^{15}$ atoms/cm$^2$ and at an energy from about 1 to about 15 keV depending upon the thickness and preferably at an energy of about 2 to about 10 keV of the sacrificial oxide. In particular, the implant energy needed to position the implant distribution peak below the oxide/substrate interface is directly proportional to the thickness of the sacrificial oxide layer.

For example, a 60 Å sacrificial oxide would require a 5 keV implant; whereas, a 100 Å sacrificial oxide would 5–10 keV energy. Calculations of the mean range of the implanted ions are shown in the following

| Implant energy (keV) | Chlorine range (A) | Bromine range (A) |
| --- | --- | --- |
| 2 | 51 | 47 |
| 5 | 93 | 79 |
| 10 | 155 | 118 |
| 15 | 206 | 154 |

The chlorine and/or bromine will enhance the subsequent thermal oxidation rate as well as immobilizing any sodium and lithium ion contamination that might be present in the gate. Moreover, in view of the relatively narrow implant distribution of chlorine and bromine, implant damage from such is confined to the regions of the subsequent thick oxide growth and the damaged silicon will be consumed in the gate oxidation process.

Figure 2:
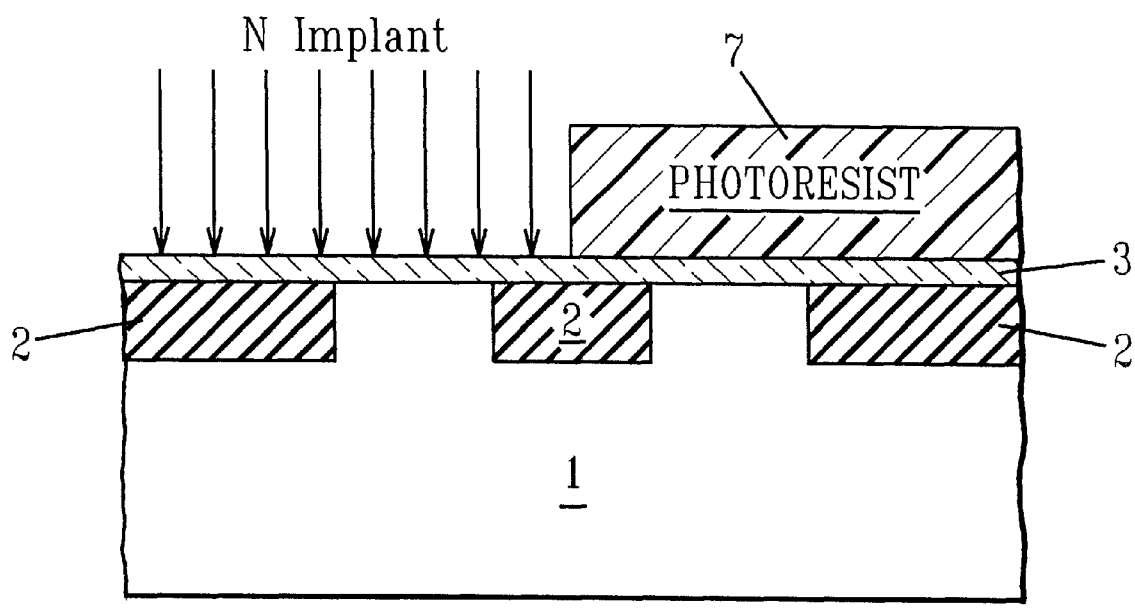
FIG. 2 is a schematic diagram of a semiconductor structure during the nitrogen ion implantation stage of fabrication according to the process of the present invention.

As illustrated in FIG. 2, the remaining photoresist 6 is next stripped by dissolution in a suitable solvent, and a photoresist 7 is applied over the sacrificial silicon dioxide layer and is patterned by conventional lithographic technique so as to mask the thicker gate oxide device areas (i.e. where doped with chlorine and/or bromine) and open regions in the resist where a thinner gate oxide is desired.

Nitrogen ions are implanted through the sacrificial silicon dioxide layer into the semiconductor substrate in the regions not covered by the photoresist. The ions are implanted at a dosage of about $2\times10^{13}$ to about $2\times10^{15}$ atoms/cm$^2$ and preferably about $5\times10^{13}$ to about $1\times10^{15}$ atoms/cm$^2$ and at an energy from about 1 to about 15 keV depending upon the thickness and preferably at an energy of about 2 to about 10 keV of the sacrificial oxide. In particular, the implant energy needed to position the implant distribution peak below the oxide/substrate interface is directly proportional to the thickness of the sacrificial oxide layer.

For example, a 60 Å sacrificial oxide would require a 2 to 5 keV implant of nitrogen; whereas, a 100 Å sacrificial oxide would require about 10 keV energy. Calculations of the mean range of the implanted ions are shown in the following table:

| Implant energy (keV) | Nitrogen range (A) |
| --- | --- |
| 2 | 78 |
| 5 | 161 |
| 10 | 295 |
| 15 | 438 |

The nitrogen retards the subsequent thermal oxidation rate.

Figure 3:
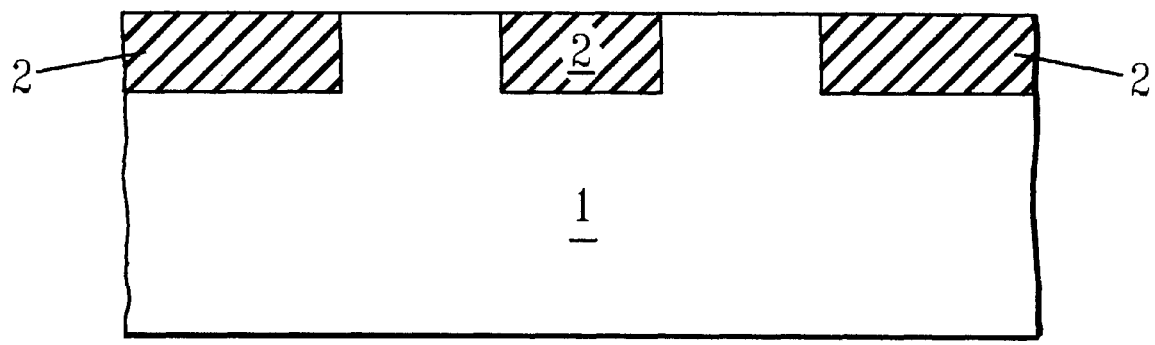
FIG. 3 is a schematic diagram of a semiconductor structure at the fabrication stage of removing a sacrificial layer according to the process of the present invention.

As illustrated in FIG. 3, the remaining photoresist 7 is next stripped by dissolution in a suitable solvent. Then, the sacrificial silicon dioxide layer 3 is removed such as by chemical etching for example in a HF solution.

Figure 4:
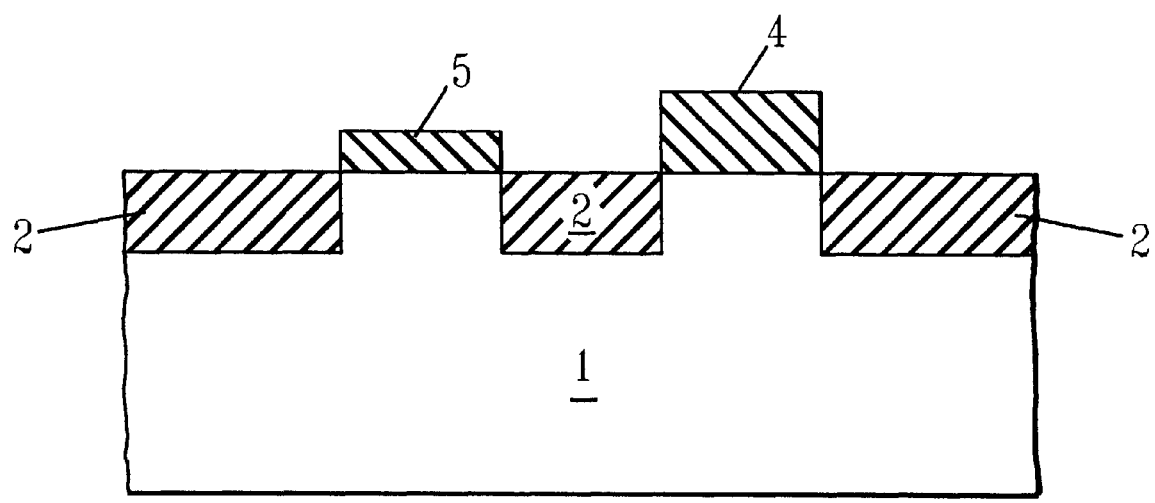
FIG. 4 is a schematic diagram of a semiconductor structure at the fabrication stage of growing a layer of silicon oxide on the semiconductor substrate.

As shown in FIG. 4, a layer of silicon dioxide is then grown on the substrate by thermal oxidation by heating the substrate to a temperature of from about 800° C. to about 1000° C. and subjecting the substrate to an oxidizing ambient such as wet or dry $O_2$. Following oxidation, the gate oxide layer 4 grown on the chlorine and/or bromine ion implanted portion of the substrate will be thicker than the gate oxide layer 5 of the nitrogen implanted portion of the substrate. This is due to the fact that the chlorine and bromine ions cause a significant increase in the growth rate of the gate oxide layer grown on the ion implanted portion, while the nitrogen causes a decrease in the growth rate of the oxide. Thus, gate oxide layers of varying thickness are simultaneously formed on a single substrate.

For example, implanting of chlorine ion at a dose of $2\times10^{15}$ chlorine atoms/cm$^2$ at an energy level of 10 keV provided an increase of about 2.2 times the thickness of the oxide where nitrogen ions are implanted at a dose of about $6\times10^{14}$ atoms/cm$^2$ at an energy level of 5 keV.

The gate oxide for the N-implanted portions was about 18 Å and that for the Cl-implanted portions was about 40 Å as determined by TEM analysis. The gate oxide grown on the portions without any implants was about 25 Å.

Next if desired, a deposited nitride layer (not shown) can be provided over the oxide or a nitridization of the oxide may be performed using the well-known nitridization by heating in NO or $N_2O$.

Next the device can be subjected to conventional techniques to provide CMOS structures conventional in the art such as NMOS and PMOS devices. For example, a layer of polysilicon can be deposited over the gate silicon dioxide layers for instance to a thickness of about 1000 to about 2000 Å and then delineated to provide the desired gate regions.

Next, source and drain regions can be provided where necessary and a dielectric layer composed of, for example, borophosphosilicate glass and/or silicon dioxide over the semiconductor device structures can be provided. Openings are then made through the dielectric layer to the source and drain regions within the semiconductor substrate where contacts are desired. A metal layer such as aluminum is deposited to fill the contact openings and patterned. Finally, a passivation layer can be provided over the integrated circuit.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for simultaneously fabricating different oxide thicknesses on the same semiconductor substrate which comprises:

forming a sacrificial silicon dioxide layer on the surface of a semiconductor substrate;

implanting nitrogen ions through the sacrificial silicon oxide layer into at least one first area of the semiconductor substrate to the oxidized while masking the other areas of the semiconductor substrate;

wherein the dosage of the nitrogen ions is about $2\times10^{13}$ to about $2\times10^{15}$ atoms/cm$^2$; and wherein the nitrogen ions are implanted at an energy of about 1 to about 15 keV; and wherein the nitrogen ions retard the oxidation rate of the semiconductor substrate;

implanting second ions selected from the group consisting of chlorine ions, bromine ions, and mixtures thereof through the sacrificial silicon dioxide layer into at least one second area of the semiconductor substrate to be oxidized while masking the other areas of the semiconductor substrate;

and wherein the second ions increase the oxidation rate of the semiconductor substrate;

removing the sacrificial silicon dioxide layer;

and then growing a layer of silicon dioxide on the surface of the semiconductor substrate wherein the growth rate of the silicon dioxide will be faster in the second area containing the second ions;

and wherein the growth rate of the silicon dioxide will be slower in the first areas containing the nitrogen ions;

and wherein the silicon dioxide layer will be thicker in the second areas compared to the silicon dioxide in the first areas not containing the second ions;

and wherein the silicon dioxide layer will be thinner in the first compared to the silicon dioxide in the areas not containing the nitrogen ions.

2. The method of claim 1 wherein nitrogen ions are implanted prior to implanting second ions.

3. The method of claim 1 wherein second ions are implanted prior to implanting nitrogen ions.

4. The method of claim 1 wherein the substrate is silicon or SOI substrate.

5. The method of claim 1 wherein the second ions are chlorine ions.

6. The method of claim 1 wherein the dosage of the second ions is about $2 \times 10^{13}$ to about $2 \times 10^{15}$ atoms/cm$^2$.

7. The method of claim 1 wherein the second ions are implanted at an energy of about 1 to about 15 keV.

8. The method of claim 1 wherein at least one of the nitrogen ions and second ions are implanted in at least two different areas of at least two different dosages.

* * * * *

UNITED STATES PATENT AND TRADEMARK OFFICE
CERTIFICATE OF CORRECTION

PATENT NO.    : 6,335,262 B1
DATED         : January 1, 2002
INVENTOR(S)   : Scott W. Crowder It is certified that error appears in the above-identified patent and that said Letters Patent is hereby corrected as shown below:

Column 6,
Line 62, change "the" (first occurrence) to -- be --.

Column 8,
Line 2, after "compared" insert -- areas --.

Signed and Sealed this

Twelfth Day of November, 2002

Attest:

Attesting Officer

JAMES E. ROGAN
Director of the United States Patent and Trademark Office